United States Patent [19]

Kirkham et al.

[11] Patent Number: 5,140,278
[45] Date of Patent: Aug. 18, 1992

[54] PHASE-LOCKED LOOP FM DEMODULATOR

[75] Inventors: Harold Kirkham, Sunland; Shannon P. Jackson, Pasadena, both of Calif.

[73] Assignee: California Institute of Technology, Pasadena, Calif.

[21] Appl. No.: 667,005

[22] Filed: Mar. 11, 1991

[51] Int. Cl.$^5$ .................. H03D 3/00; H03L 7/091
[52] U.S. Cl. ...................... 329/325; 331/23; 331/25
[58] Field of Search ............... 329/307, 308, 309, 325, 329/326, 341, 342, 343; 331/1 A, 23, 25; 375/120

[56] References Cited

U.S. PATENT DOCUMENTS

| | | | |
|---|---|---|---|
| 3,142,806 | 7/1964 | Fernandez | 329/107 |
| 3,567,959 | 3/1971 | Kaneko et al. | 307/232 |
| 3,697,781 | 10/1972 | McLean | 307/235 |
| 3,761,829 | 9/1973 | Spaulding | 329/104 |
| 3,761,874 | 9/1973 | Landrum, Jr. | 340/17 |
| 3,973,212 | 8/1976 | Walloch | 329/122 |
| 3,979,692 | 9/1976 | Benoist et al. | 331/1 A |
| 3,980,971 | 9/1976 | Sato | 332/10 |
| 4,004,235 | 1/1977 | Roberts | 328/110 |
| 4,184,122 | 1/1980 | Clark et al. | 331/1 A X |
| 4,344,040 | 8/1982 | Reilly et al. | 329/50 |
| 4,550,424 | 10/1985 | Cheng et al. | 381/15 |
| 4,564,823 | 1/1986 | Stahler | 329/341 X |
| 4,608,540 | 8/1986 | Tsuchiya et al. | 329/107 |
| 4,628,271 | 12/1986 | Takayama | 329/50 |
| 4,672,447 | 1/1987 | Moring et al. | 358/148 |
| 4,682,118 | 7/1987 | Thiel | 329/122 |
| 4,780,887 | 10/1988 | Otani et al. | 375/80 |
| 4,864,252 | 9/1989 | Heck | 331/1 A |

OTHER PUBLICATIONS

P. Horowitz and W. Hill, "The Art of Electronics", Cambridge University Press, Second Edition, 1989, pp. 644–645.

Primary Examiner—David Mis
Attorney, Agent, or Firm—Antonio M. Fernandez

[57] ABSTRACT

A conventional phase-locked loop is improved by replacing its phase detector with one comprising a linear ramp generator and a sample-and-hold circuit, thus eliminating the need for a lowpass loop filter, although the output of the sample-and-hold circuit may be filtered in the case of a very low level modulating signal on the incoming FM signal, but then filtering is not a difficult problem as in a conventional phase-locked loop. The result is FM demodulation by zero-order estimation. For FM demodulation by first-order estimation, the arithmetic difference between adjacent samples is formed, and using a second sample-and-hold circuit an arithmetic difference signal is produced as an input to a second ramp generator that is reset after each sampling cycle to generate a ramp the slope of which is a function of the arithmetic difference signal stored in the second sample-and-hold circuit. The ramp thus generated by the second ramp generator is arithmetically summed with the zero-estimation signal from the first sample-and-hold circuit to form a first-order estimation signal. Filtering such a first-order estimation signal is less of a problem than filtering a zero-order estimation signal.

4 Claims, 2 Drawing Sheets

PHASE-LOCKED LOOP FM DEMODULATOR

ORIGIN OF THE INVENTION

The invention described herein was made in the performance of work under a NASA contract, and is subject to the provisions of Public Law 96-517 (35 USC 202) in which the Contractor has elected to retain title.

TECHNICAL FIELD

The invention relates to a phase-locked loop FM demodulator and more particularly to a sample-and-hold, time-frequency measuring circuit that is linearized by including it in a phase-locked loop.

BACKGROUND ART

A conventional phase-locked loop (PLL) shown in FIG. 1 contains a phase detector or comparator 1 which compares the phase of an incoming signal with that of a locally generated signal, a lowpass loop filter 2 which smooths the phase comparator output to produce an error signal, and a voltage-controlled oscillator (VCO) 3 whose frequency is a function of the applied error signal voltage. Two major applications for phase-locked loops are recovering clean signals from noisy ones and demodulating FM signals from their carriers. The present invention is concerned primarily with the second one. Typical applications of FM demodulation are tone decoding, carrier frequency acquisition and carrier tracking.

Nominally, the process of demodulation is the extraction of the modulation information from the modulated carrier. Whatever demodulation process is used, a certain amount of the carrier is bound to remain. When the carrier frequency is decreased, the problem of separating this residual carrier from the desired output becomes more difficult unless the bandwidth of the modulating signal is also decreased.

There are two kinds of phase detectors used in phase-locked loops: one designed to be driven by analog signals (e.g., a four-quadrant multiplier) and the other designed to be driven by digital transitions (e.g., edge timing between the incoming signal and a VCO output signal). Horowitz and Hill, *The Art of Electronics*, Cambridge University Press, Second Edition, 1989, pp. 644-645. The first type, also known as a balanced mixer, produces an output voltage after filtering that is a function of the phase difference. This may be applied to the VCO as a control voltage. The second type of phase detector, sensitive to only the timing of the edge of the reference frequency cycle as compared to the edge of the input frequency cycle, is generally more complex.

As an illustration of the nature of the filtering problem, note that with the typical multiplying-type phase detector, the lowest frequency component of the phase detector output is at twice the carrier frequency, $f_o$. However, the amplitude of this component is large, regardless of the amplitude of the modulating signal, because this kind of phase detector switches between two extreme states. Typically, the signal applied to the low-pass loop filter is a squarewave with peak amplitude equal to the local power supply voltage. Stability considerations and simplicity of calculation dictate the use of simple lowpass or lag-lead filters inside the loop. The filter of a wideband loop removes little of the energy of the signal at $2f_o$. For an undistorted output, a post-detector filter 4 of considerable quality is required.

When a phase-locked loop is used in a communication system, the phase detector and lowpass filter determine the lock range, the capture range and the noise performance of the loop. If the incoming signal has a large signal-to-noise ratio, there is less or no concern about noise performance. When used in the system as an FM demodulator, the loop filter has to be a compromise between flat frequency response and rejection of phase detector noise. As spectral frequency of the incoming carrier approaches the modulation frequency, this compromise becomes difficult to resolve. This invention addresses that problem.

STATEMENT OF THE INVENTION

In accordance with the present invention, a conventional phase-locked loop comprised of a phase detector, a lowpass filter and a voltage controlled system is improved by replacing the phase detector and lowpass filter with a state estimator, which in a preferred embodiment is comprised of a linear ramp generator and a sample-and-hold circuit. The ramp generator is triggered to start ramping in response to the leading edge of a cycle in the output signal of the voltage controlled system, and the sample-and-hold circuit is triggered by a sample pulse generating means responsive to the leading edge of a cycle of an incoming signal, or conversely. The sampling pulse then resets the ramp generator via a delay means before the next cycle of the reference frequency signal. The output of the sample-and-hold circuit is applied (possibly without a loop filter) to the voltage controlled system so that the locally generated frequency tracks the input signal frequency. The output of the phase-locked loop thus implemented exhibits a flat frequency response with good rejection of phase detector noise. The ripple component of the phase detector output is greatly reduced in comparison with either of the conventional phase detectors.

The phase-locked loop comprised of one ramp generator and one sample-and-hold circuit as just described constitutes a zero-order estimator. A first-order estimator can be achieved by linearly interpolating between adjacent samples. This can be implemented by obtaining the difference between adjacent samples of the zero-order estimator and through a second sample-and-hold circuit storing the difference sample through the next incoming signal pulse period. A second ramp generator is driven by the stored difference sample to generate a ramp whose slope depends on the magnitude and sign of that difference.

The novel features that are considered characteristic of this invention are set forth with particularity in the appended claims. The invention will best be understood from the following description when read in connection with the accompanying drawings.

DETAILED DESCRIPTION OF THE INVENTION

Figure 2:
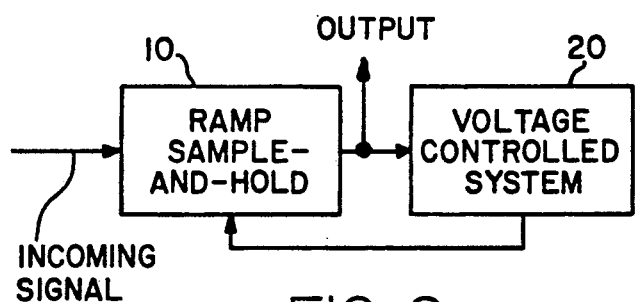
FIG. 2 is a functional block diagram of a phase-locked loop in accordance with the present invention.

Referring to FIG. 2, the phase-locked loop FM demodulator comprised of a ramp sample-and-hold circuit 10 and a voltage controlled system 20 can be zero order for maximum simplicity, as will be described in a specific example with reference to FIG. 3, or first order for slightly improved performance, as will be described in a specific example with reference to FIG. 5. A first-order sample-and-hold circuit is, in principle, preferred although more complicated to implement. In an experimental prototype an analog sample switch and an analog (op-amp) integrator was used as a ramp generator for the ramp sample-and-hold circuit 10, but the system may be implemented in other ways, for example using an up/down counter to act as a phase comparator. A push-pull system with two ramp sample-and-hold systems working on alternate cycles is also possible.

In operation, the ramp sample-and-hold circuit 10 is triggered to start ramping in response to the leading edge of a cycle in the output signal of the voltage controlled system 20 and triggered to sample the ramp by the leading edge of a cycle of the incoming signal, or conversely to produce an error signal proportional to the phase difference thus measured. The error signal is then applied to the voltage control system 20.

Figure 1:
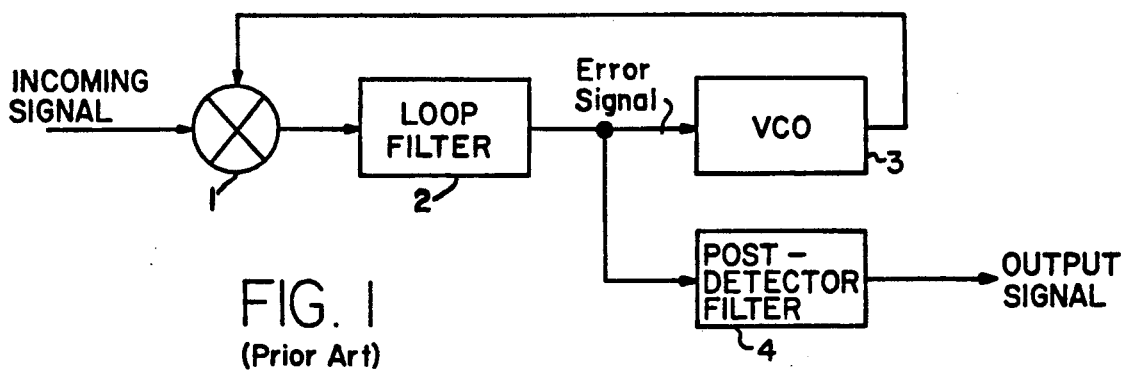
FIG. 1 is a functional block diagram of a conventional phase-locked loop.
Figure 3:
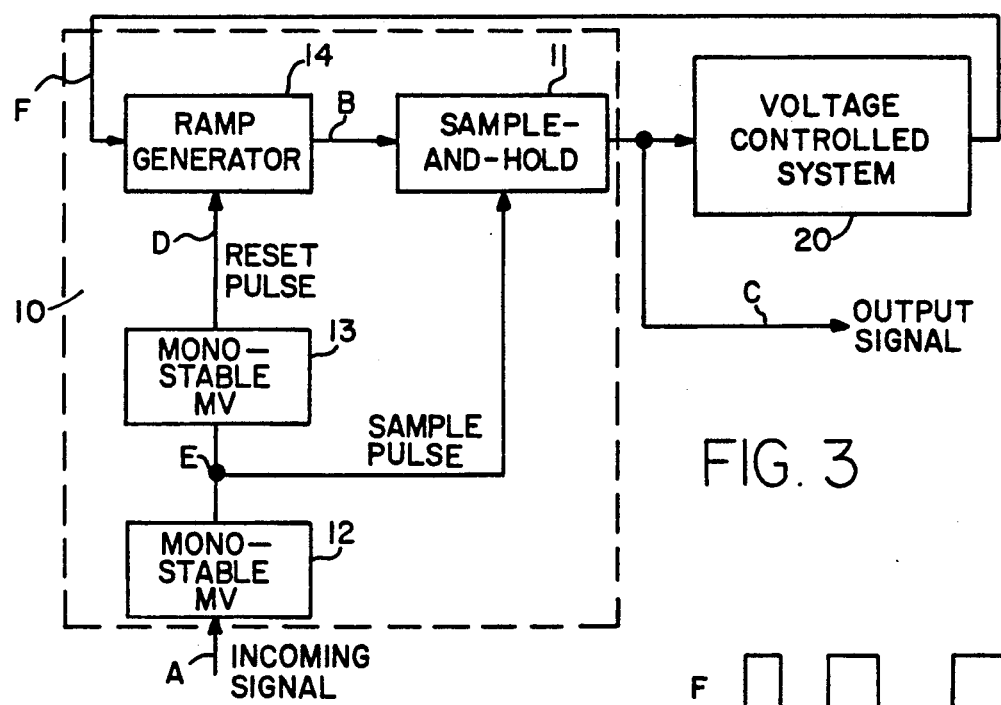
FIG. 3 illustrates in greater detail a functional block diagram of a phase-locked loop FM demodulator implemented in accordance with the present invention for zero-order estimation of the modulating signal on the incoming carrier signal.

Referring to FIG. 3, which shows in greater detail a functional block diagram of a phase-locked loop in accordance with the invention illustrated in FIG. 2, a sample-and-hold circuit 11 is caused to sample a linear ramp signal B by each cycle of an incoming signal A via a monostable multivibrator 12. A second monostable multivibrator 13 is employed to delay a reset pulse D for a period required to sample the output of a ramp generator 14. Resetting the ramp generator prepares the sample-and-hold circuit 11 for the next cycle of the incoming signal A. The voltage controlled system 20 produces a squarewave signal F shown in FIG. 4. In most applications, the voltage controlled system may be implemented as a voltage controlled oscillator, such as a voltage controlled relaxation oscillator.

FM demodulation by zero-order estimation is as follows. Assume that a reset pulse D has just reset the ramp generator to zero. The phase-locked loop is static until another cycle of the squarewave signal F from the voltage controlled system 20 begins. This starts the ramp signal B. A cycle from the incoming signal A triggers the monostable multivibrator 12 which produces a sample pulse E that causes the circuit 14 to sample and hold the value of the ramp at that instant. The signal C that appears on the output of the sample-and-hold circuit 11 is thus a measure of the time difference between a cycle of the signal F from the voltage controlled system 20 and a cycle of the incoming signal A. The trailing edge of the sample pulse E from the monostable multivibrator 12 triggers the second monostable multivibrator 13 which in turn emits a pulse D that resets the ramp generator 14 as shown in the timing diagram of FIG. 4. The second monostable multivibrator 13 is set to trigger on the trailing edge of the sample pulse E issued by the first monostable multivibrator 12 to delay the reset until the sample-and-hold circuit 11 has had time to acquire a new sample. The circuit repeats with every cycle of the input signal A.

Because the sample-and-hold circuit 11 is inside a phase-locked loop, the time difference between a cycle of the incoming signal A and a cycle of the signal F from the voltage controlled system 20 is a measure of the phase difference. The ramp generator 14 and sample-and-hold circuit 11 together perform the function of a phase detector in a phase-locked loop. For a decreasing frequency of the incoming signal, the output signal C of the sample-and-hold circuit 11 is thus a staircase control waveform for the voltage control system 20. It is also the FM demodulated output signal of the input signal A.

As noted hereinbefore, there are two types of phase detectors known in the prior art. The present invention represents a third type which in its simplest implementation shown in FIG. 3 is a zero-order loop, i.e., a loop that has no derivative compensation. To compare this third type of phase detector with the two prior-art types, phase-locked loops with each type of phase detector were prepared as demodulators of a low-frequency FM carrier, and all loops were fed the same FM modulated signal for comparison at 2 mV, 20 mV and 200 mV level of modulation. The results clearly showed a low noise content of the demodulated signal using a phase-locked loop of this Type III as compared to Types I and II.

The 20 mV level of modulation is regarded as being in the "middle" of the usable range of input signals. The loop output of the Type I detector was predominantly a square wave at the carrier frequency (about 7000 Hz), effectively pulse width modulated at 80 Hz. The carrier was over 30 dB higher than the signal that was desired, which means the filtering that would necessarily be applied in the prior art Type I phase detector must cope with a noise over 30 times higher than the desired signal. The loop error voltage of a Type II phase detector showed that it may be an improvement over the Type I, but in fact the improvement is not as great as it seems. The noise component was still almost equal in magnitude to the signal.

The output of the Type III phase-locked loop illustrated in its simplest form in FIG. 3 showed that it was made up of short segments, but apart from that noise was not visible. A clean replica of the 20 mV modulated signal was seen to have been produced in the loop error voltage; therefore no filtering was necessary. This impression was confirmed by spectrum analysis which showed the carrier component was now a full 40 dB (a factor of 100) below the signal. It is important to understand that in this spectrum analysis, the loop output signal had not been filtered. The advantage of the Type III loop is that very little, if any, filtering is required to recover a very clean signal from a low frequency carrier.

With a larger modulation signal (200 mV), performance of the Type I loop showed the loop error voltage to be about the same as before (a square wave of over 5 V peak amplitude). The spectrum of the loop error voltage showed that loop performance had changed with a greater depth of modulation, i.e., a modulation signal of greater amplitude. The peak amplitude of the carrier was now only about 10 dB (a factor of 3) above the signal, but the total carrier energy was spread over a wider part of the spectrum. In the analysis of a prototype, a component at half the carrier frequency appeared. However, this small noise is believed to have been due to the particular way the Type I loop was implemented.

The Type II loop output with a 200 mV modulation showed large pulses that had saturated in the output. A change in level was now more obvious: this was the recovered signal expected. The spectrum of the received signal, now about 10 dB above the peak of the carrier, spread considerably. Its energy content was still large compared to the expected (desired) signal.

The output of the Type III loop changed little with a large modulation signal of 200 mV. It was still comprised of small segments, and the same number of segments seemed to be present as for modulation with a 20 mV signal. The spectrum showed that the signal was now more than 40 dB above the carrier. As in the Type I and Type II loops, the carrier had spread because of the depth of modulation by the large modulation signal.

With a very small (2 mV) modulation signal, the output signal of the Type I loop was almost a squarewave with amplitude set by the power supply voltage. The output spectrum showed that the desired signal was almost 60 dB (a factor of 1000) below the carrier level. This presented a considerable problem in the output filter stages that would be required to recover the signal.

Noise spikes are the dominant feature of the Type II loop output for demodulation of a very small (2 mV) modulation signal. The output spectrum showed that the noise spikes were equal to or larger than the signal. A half-carrier-frequency component was also visible, making the necessary filtering problem worse.

Some noise was visible in the Type III output signal for demodulation of a very small (2 mV) modulation signal, both in terms of high frequency noise spikes and random level fluctuations, but the output spectrum showed that the signal was still almost 40 dB above the carrier. Therefore removing noise from this Type III output signal by filtering, if desired, would not be a problem.

FM Demodulation by First-Order Estimation

The interval between the pulses of incoming data in a frequency modulated data link contains information about the modulation going on at the transmitter. The interval between any two adjacent pulses can therefore, in principle, be used to estimate the state of the transmitter. In essence, the phase-locked loop of the present invention (referred to above as the Type III) attempts to duplicate in the demodulator the events going on in the modulator.

The interval between pulses originating in the transmitter is used at the receiver as an estimate of the modulating voltage on the control terminal of a voltage controlled oscillator (VCO) at the transmitter. A voltage derived from this estimate is applied to a voltage control system (VCS) implemented as a voltage control oscillator (VCO) at the receiver, which therefore mimics the transmitter VCO. The accuracy of reproduction is controlled by the fact that the loop is closed; any deviation represents an error that will generate a correcting signal in the phase-locked loop.

The simplest way of estimating what is going on in the transmitter is to assume that the control voltage applied to the VCO at the transmitter did not change during the period between output pulses. This is what was described above with reference to FIGS. 3 and 4 for a zero-order estimation. It results in a loop whose dynamics approximate those of a conventional Type I or Type II first-order loop; the estimate of the modulating signal is known as a zero-order estimate.

In the following discussion of a Type III phase locked loop for a first-order estimation, it is necessary to distinguish between the order of the estimator and the order of the loop. If the modulating signal at the transmitter is constant, there is no estimation error at the receiver. If the modulating signal is changing at a constant rate, there is an error at the receiver due to the step-like nature of the approximation. This can be seen in FIG. 4 by the staircase output signal C of the zero-order estimator in FIG. 3. But if information about the way the period changes from interval to interval is incorporated, a first-order estimator results. Thus, in a general state estimation scheme, a first-order estimate can be obtained by incorporating information about the difference between adjacent samples of the data.

For example, assume that between one sample and the next, the value is found to have increased by 10%. The zero-order phase-locked loop of FIG. 3 would assume that the last sample is the best estimate until the next sample, and a 10% step in the output signal C is produced. A first-order estimator would instead determine that there will be a further 10% increase in the estimate during the next interval in order to modify the output signal C to have a ramp starting at the last sample and calculated to increase the output signal C by 10% during the period to the next incoming signal cycle. A first-order estimator must therefore be a little more complex than the zero-order estimator of FIG. 3, as shown in FIG. 5.

The first-order estimator shown in FIG. 5 functions as follows. Control signals (short pulses) are derived, as before, from cycles of the incoming signal by means of simple delay circuits. A zero-order estimator is implemented as a ramp sample-and-hold circuit 10 as in FIG. 3 by means of a ramp generator 14 and a sample-and-hold circuit 11. To make the ramp sample-and-hold circuit 10 a first order estimator, additional hardware computes the difference between the adjacent sample intervals. An analog difference circuit 15 continuously monitors the difference between the output (last sample) of the ramp sample-and-hold circuit 10 and the input (next sample) of the sample-and-hold circuit 11. At the instant that the zero-order sample-and-hold circuit 11 is triggered to sample, this difference represents the change in the signal between the two successive intervals. This difference is sampled by a second sample-and-hold circuit 16 simultaneously with or just before the next sample in the zero-order estimator section of the demodulator. This is accomplished by triggering the second sample-and-hold circuit 16 with a sample pulse produced earlier than the next sample pulse for the first sample-and-hold circuit 11 in response to the same incoming signal pulse, such as by introducing a very short delay by an element D in the path of the sample pulse to the zero-order estimate sample-and-hold circuit 11 so that the difference between the last sample and the next sample may be computed by the circuit 15 just as the next sample is taken, or just before the next sample is taken by the sample-and-hold circuit 11.

A second ramp circuit 17 is used to generate a ramp whose slope depends on the sampled output of the arithmetic difference circuit 15. That sampled difference is held by the sample-and-hold circuit 16 until the next sample pulse is produced by the incoming signal A. The direction of the ramp depends on the sign of the difference, while the slope of the ramp is controlled by the magnitude of the difference. A first-order estimate is then obtained by arithmetic addition of the zero-order estimate signal C and the difference-generated ramp signal in a summing circuit 18.

As may be expected, the output of the loop with a first-order estimator mimics the modulating signal at the transmitter much better than the output of the zero-order estimation, because instead of the staircase zero-order estimation signal C there is a ramped segment from the beginning of one step to the beginning of the next step. Upon performing a spectrum analysis, it was noted that some of the expected improvement in noise was not realized. There are two reasons for this: the first-order estimator requires more digital switching of signals, and these fast, short switching pulses tend to feed through into some of the analog circuitry; and the difference signal is a small value obtained by subtracting one large signal from another so that the differencing process is inherently noisy. Nevertheless, the carrier rejection properties of the loop are measurably better than those obtained with just the zero-order estimator, and any noise remaining may be easily filtered if required.

Figure 5:
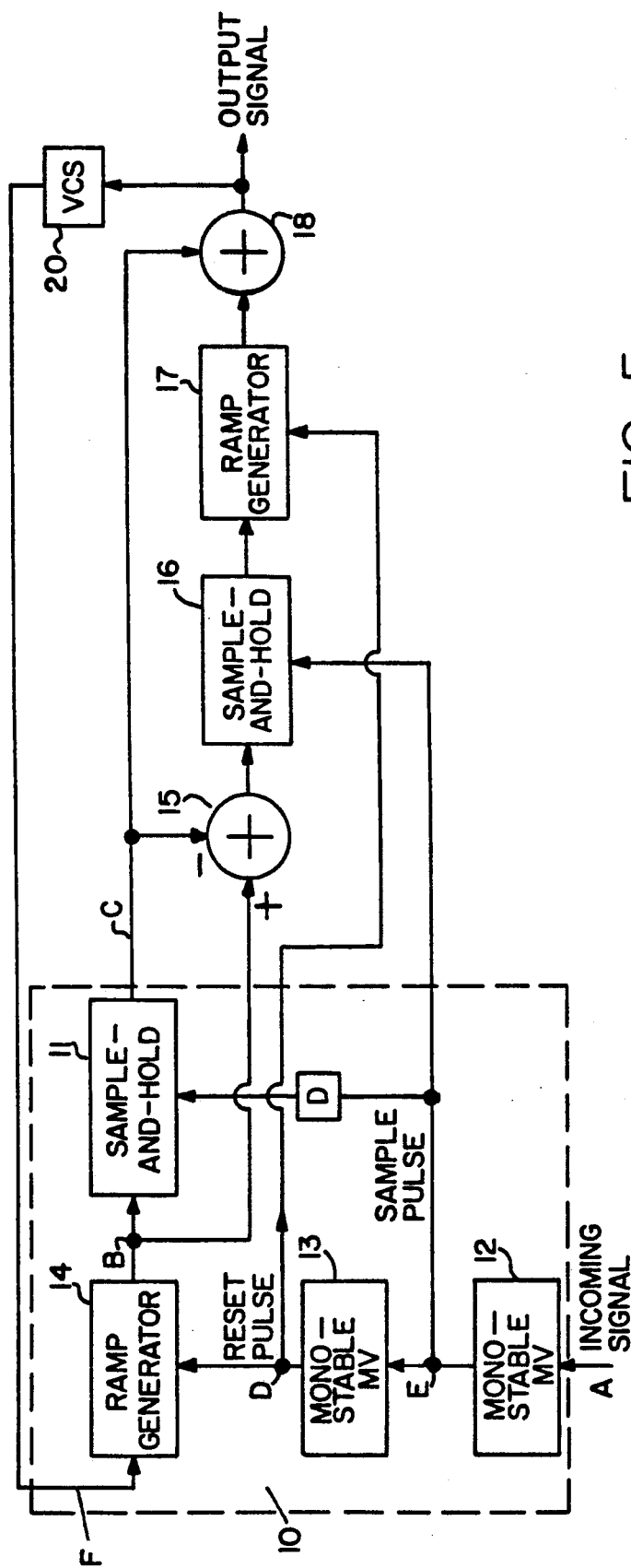
FIG. 5 illustrates a phase-locked loop FM demodulator implemented in accordance with the present invention for first-order estimation of the modulating signal.

There is no doubt that the output of the phase-locked loop of FIG. 5 is a remarkable reconstruction of the modulation signal used at the transmitter. It should be remembered that the waveforms shown here are not filtered at all. Not only is the additional circuitry of an analog filter not required, but the unavoidable effects of such a filter on the frequency response and the phase response of the loop are avoided.

Figure 4:
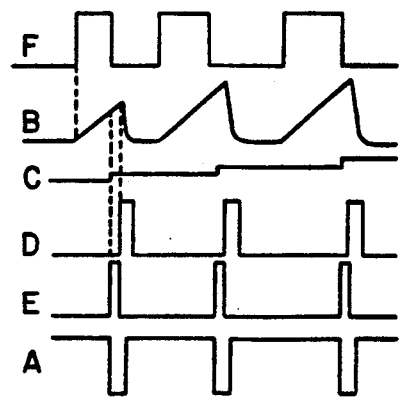
FIG. 4 is a timing diagram of signals in the phase-locked loop FM demodulator illustrated in FIG. 3.

Although particular embodiments of the invention have been described and illustrated herein, it is recognized that modifications and variations may readily occur to those skilled in the art. For example, although the voltage control system for an FM demodulator at a receiver may be implemented as a voltage controlled relaxation oscillator to produce the waveform F in FIG. 4 for most applications, for other applications where the incoming signal frequency is very low, an electromechanical system may be employed to implement a voltage controlled system that produces the waveform F. In addition, it should be noted that the input signal A shown in FIG. 4 are short negative-going pulses which would need to be formed at the receiver of an FM modulated signal, such as by zero-crossing detection of the cycles of the FM modulated signal, and at each negative to positive (or positive to negative) crossover, triggering a monostable multivibrator to produce the short pulses of the waveform A.

Another variation suggested hereinbefore is the converse of measuring the time difference between a cycle of the incoming signal A and a cycle of the signal F from the voltage controlled system 20 as a measure of phase difference. This is readily accomplished by resetting the ramp generator 14 with the output F of the voltage control system 20 and starting the ramp generator with the incoming signal A, i.e., by interchanging the connections for the signals A and F in FIGS. 3 and 5. Consequently, it is intended that the claims be interpreted to cover such modifications and variations as well as producing the short pulses of the incoming signal A, one pulse for each cycle of the incoming FM modulated signal.

We claim:

1. A phase-locked loop of the type having a controlled system which produces at an output terminal thereof in response to a control signal at an input terminal thereof a locally generated cyclical signal that tracks the frequency of a frequency modulated incoming signal, said phase-locked loop comprising means for producing a signal which increases linearly as a function of time from a reference value, means for sampling said linearly increasing signal to produce said control signal and for holding said control signal for periods between corresponding fixed phase points in each cycle of said locally generated cyclical signal and each cycle of said frequency modulated incoming signal, thereby producing a control signal after each sampling of said linearly increasing signal proportional to each of said periods between said fixed phase points in each cycle of said locally generated signal and each cycle of said frequency modulated incoming signal from cycle to cycle, each control signal level thus produced after each sampling being held until a new sample produces a new level, and means for applying said control signal to said controlled system to continually cause said locally generated cyclic signal produced by said controlled system to adjust in frequency to said incoming signal, wherein said means for sampling and holding a sample for periods between corresponding fixed phase points in each cycle of said locally generated signal and each cycle of said incoming signal is comprised of a sample-and-hold circuit in cascade between said output terminal of said controlled system and said control terminal of said controlled system, said linearly increasing signal generating means being responsive to a selected one of said locally generated cyclical signal and said incoming signal for setting said reference value upon the occurrence of a fixed phase point of said selected signal, and being response to said nonselected one of said locally generated cyclic signal and said incoming signal for resetting said linearly increasing signal generating means following each sampling operation, whereby said sample-and-hold means provides a signal at said control terminal of said controlled system the magnitude of which is a function of the period between corresponding fixed phase points of said locally generated signal and said incoming signal to match the cycles of said locally generated cyclical signal with the cycles of said incoming signal.

2. A phase-locked loop FM demodulator for extracting a first-order estimation of an analog signal frequency modulated on a carrier of the type having a controlled system which produces at an output terminal thereof a locally generated cyclical signal that tracks the frequency of a frequency modulated incoming signal, said phase-locked loop FM demodulator comprising means for producing a signal which increases linearly as a function of time from a reference value and a sample-and-hold means in cascade between said output terminal of said controlled system and a control terminal of said controlled system, said linearly increasing signal generating means being responsive to a selected one of said locally generated cyclical signal and said incoming signal for setting said reference value upon the occurrence of a fixed phase point of a selected one of said locally generated cyclical signal and said frequency modulated incoming signal, means for initiating an operation of said sample-and-hold means to sample said linearly increasing signal at the beginning of each cycle of said nonselected one of said locally generated cyclical signal and said incoming signal, whereby said sample-and-hold means provides a signal at said control terminal of said controlled system the magnitude of which is a function of the period between corresponding fixed phase points of said locally generated signal and said incoming signal to match the cycles of said locally generated cyclical signal with the cycles of said incoming signal, means for generating a signal that is equal to the arithmetic difference between said linearly increasing signal at or just before the beginning of said fixed phase point of the next cycle of said nonselected signal and the last sample taken at said fixed phase point of the current cycle of said nonselected signal and held by said sample-and-hold means, a second sample-and-hold means and means for initiating an operation of said second sample-and-hold means to sample said arithmetic difference signal at said fixed phase point of said next cycle of said nonselected signal and hold it for one cycle of said input signal, a ramp signal generating means for generating a linear ramp signal of a slope that is a function of said arithmetic difference signal, said second ramp signal generating means being connected to said second sample-and-hold means for receiving said arithmetic difference signal, means for resetting said ramp generating means following each sampling operation of said second sampling means, and means for generating a control signal to said voltage controlled system that is equal to the arithmetic sum of said control signal from said first sample-and-hold means and said ramp signal from said ramp generating means.

3. A phase-locked loop FM demodulator for extracting a zero-order estimation of an analog signal frequency modulated on a carrier signal comprising a controlled system having a control input terminal and an output terminal for producing a cyclical signal at said output terminal, said cyclical signal having a period for each cycle that is a function of a control signal at said control input terminal, a ramp signal generator having an input terminal connected to said output terminal of said controlled system for producing a ramp signal at an output terminal thereof starting at a reference level in response to the beginning of a cycle of said cyclical signal at said output terminal of said voltage controlled system and a control terminal for resetting said ramp signal at said reference level, said ramp signal generator having a reset terminal for resetting said ramp signal generator to said reference level in response to a reset control pulse, a sample-and-hold circuit having an input terminal connected to said output terminal of said ramp signal generator and a control input terminal connected to receive a sample control pulse for sampling the instantaneous level of said ramp signal, and holding at said control input terminal of said controlled system said sample of said ramp signal until the occurrence of the next sample control pulse, means responsive to said incoming frequency modulated signal for generating said sample control pulse at the beginning of each cycle of said incoming frequency modulated signal, and means responsive to said sample control pulse for producing a delayed reset pulse at said control terminal of said ramp signal generator, whereby said ramp signal generator is reset to said reference after said sample pulse has been generated and before initiation of the next cycle of said cyclical signal generated by said controlled system, and said sample-and-hold circuit produces at said control input terminal of said controlled system a control signal the amplitude of which is a zero-order estimation of said analog signal frequency modulated on said carrier signal.

4. A phase-locked loop FM demodulator as defined in claim 3 further comprising means for generating an arithmetic difference signal that is equal to said ramp voltage signal just before the beginning of the next cycle of said incoming signal and the last sample taken at the beginning of the current cycle of said incoming signal and held by said sample-and-hold circuit, a second sample-and-hold circuit and means for initiating an operation of said second sample-and-hold circuit to sample the instantaneous voltage of said arithmetic difference signal at the beginning of said next cycle of said incoming signal, ramp generating means connected to said second sample-and-hold circuit for receiving a sample of said arithmetic difference signal held by said second sample-and-hold circuit following each sampling operation, and producing at an output terminal thereof a ramp signal whose slope is a function of said arithmetic difference signal sample, means for resetting said second ramp generator to said reference signal following each sampling operation, and means for producing a signal that is the arithmetic sum of said control signal to said controlled system and said output terminal of said second ramp generating means.

* * * * *